(12) United States Patent
Woody et al.

(10) Patent No.: US 10,418,556 B2
(45) Date of Patent: Sep. 17, 2019

(54) CONJUGATED POLYMER BLENDS FOR HIGH EFFICIENCY ORGANIC SOLAR CELLS

(71) Applicant: PHILLIPS 66 COMPANY, Houston, TX (US)

(72) Inventors: Kathy Woody, Bartlesville, OK (US); Brian Worfolk, Bartlesville, OK (US); Laura Nielsen, Bartlesville, OK (US)

(73) Assignee: Phillips 66 Company, Houston, TX (US)

( * ) Notice: Subject to any disclaimer, the term of this patent is extended or adjusted under 35 U.S.C. 154(b) by 7 days.

(21) Appl. No.: 15/592,998

(22) Filed: May 11, 2017

(65) Prior Publication Data

US 2017/0331046 A1    Nov. 16, 2017

Related U.S. Application Data

(60) Provisional application No. 62/336,016, filed on May 13, 2016.

(51) Int. Cl.
*H01L 51/00* (2006.01)
*C08G 61/12* (2006.01)
*H01L 51/42* (2006.01)

(52) U.S. Cl.
CPC ........ *H01L 51/0036* (2013.01); *C08G 61/126* (2013.01); *H01L 51/0043* (2013.01);
(Continued)

(58) Field of Classification Search
CPC ........ C08G 2261/124; C08G 2261/142; C08G 2261/1424; C08G 2261/1432;
(Continued)

(56) References Cited

U.S. PATENT DOCUMENTS 9,006,568 B2 * 4/2015 Wang ................... C07D 495/04
                                                          136/263
9,680,103 B2 * 6/2017 Sugiura ............... H01L 51/0036
(Continued)

FOREIGN PATENT DOCUMENTS

WO    WO-2014042091 A1 *  3/2014  ........... C08G 61/126

OTHER PUBLICATIONS

WO-2014042091-A1, Mar. 2014, Machine translation.*
(Continued)

*Primary Examiner* — Satya B Sastri
(74) *Attorney, Agent, or Firm* — Phillips 66 Company

(57) ABSTRACT

The invention relates to a process for producing a conjugated polymer blend. The process for producing the conjugated polymer blend comprises the mixture of: a polymer A (X-Y), where X is (Continued)

and Y is

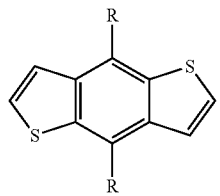

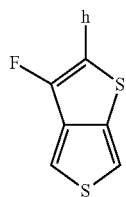

and h is a substituent, a polymer B (X-Y') where X is

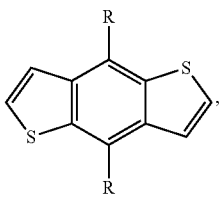

Y' is

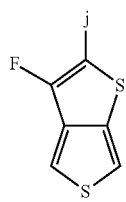

and j is a substituent, and an acceptor. In this process h and j are different substituents and independently selected from each other.

1 Claim, 10 Drawing Sheets

(52) U.S. Cl.
CPC . *C08G 2261/124* (2013.01); *C08G 2261/142* (2013.01); *C08G 2261/145* (2013.01); *C08G 2261/146* (2013.01); *C08G 2261/148* (2013.01); *C08G 2261/1424* (2013.01); *C08G 2261/1432* (2013.01); *C08G 2261/3243* (2013.01); *C08G 2261/41* (2013.01); *C08G 2261/91* (2013.01); *H01L 51/005* (2013.01); *H01L 51/4253* (2013.01); *Y02P 70/521* (2015.11)

(58) Field of Classification Search
CPC ........ C08G 2261/145; C08G 2261/146; C08G 2261/148; C08G 2261/3243; C08G 2261/41; C08G 2261/91; C08G 61/126; H01L 51/0036; H01L 51/0043; Y02P 70/521
See application file for complete search history.

(56) References Cited

U.S. PATENT DOCUMENTS

2013/0123449 A1*  5/2013  Hou ................ B82Y 10/00
                                                          526/256
2015/0344616 A1* 12/2015  Woody ............ C08G 61/126
                                                          526/171

OTHER PUBLICATIONS

Brett M. Savoie, Scott Dunaisky, Tobin J. Marks and Mark A. Ratner, "The Scope and Limitations of Ternary Blend Organic Photovoltaics", Advanced Energy Materials, 2014, 6 pages.
Petr P. Khlyabich, Andrey E. Rudenko, Robert A. Street and Barry C. Thompson, "Influence of Polymer Compatibility on the Open-Circuit Voltage in Ternary Blend Bulk Heterojunction Solar Cells", Department of Chemistry and Loker Hydrocarbon Research Institute, University of Southern California, Applied Materials & Interfaces, 2014 American Chemical Society, vol. 6, pp. 9913-9919.
Rui Lin, Matthew Wright, Kah Howe Chan, Binesh Puthen-Veettil, Rui Sheng, Xiaoming Wen, Ashraf Uddin, "Performance Improvement of Low Bandgap Polymer Bulk Heterojunction Solar Cells by Incorporating P3HT", School of Photovoltaic and Renewable Energy Engineering, University of New South Wales, Elsevier, Organic Electronics, vol. 15, 2014, pp. 2837-2846.

* cited by examiner

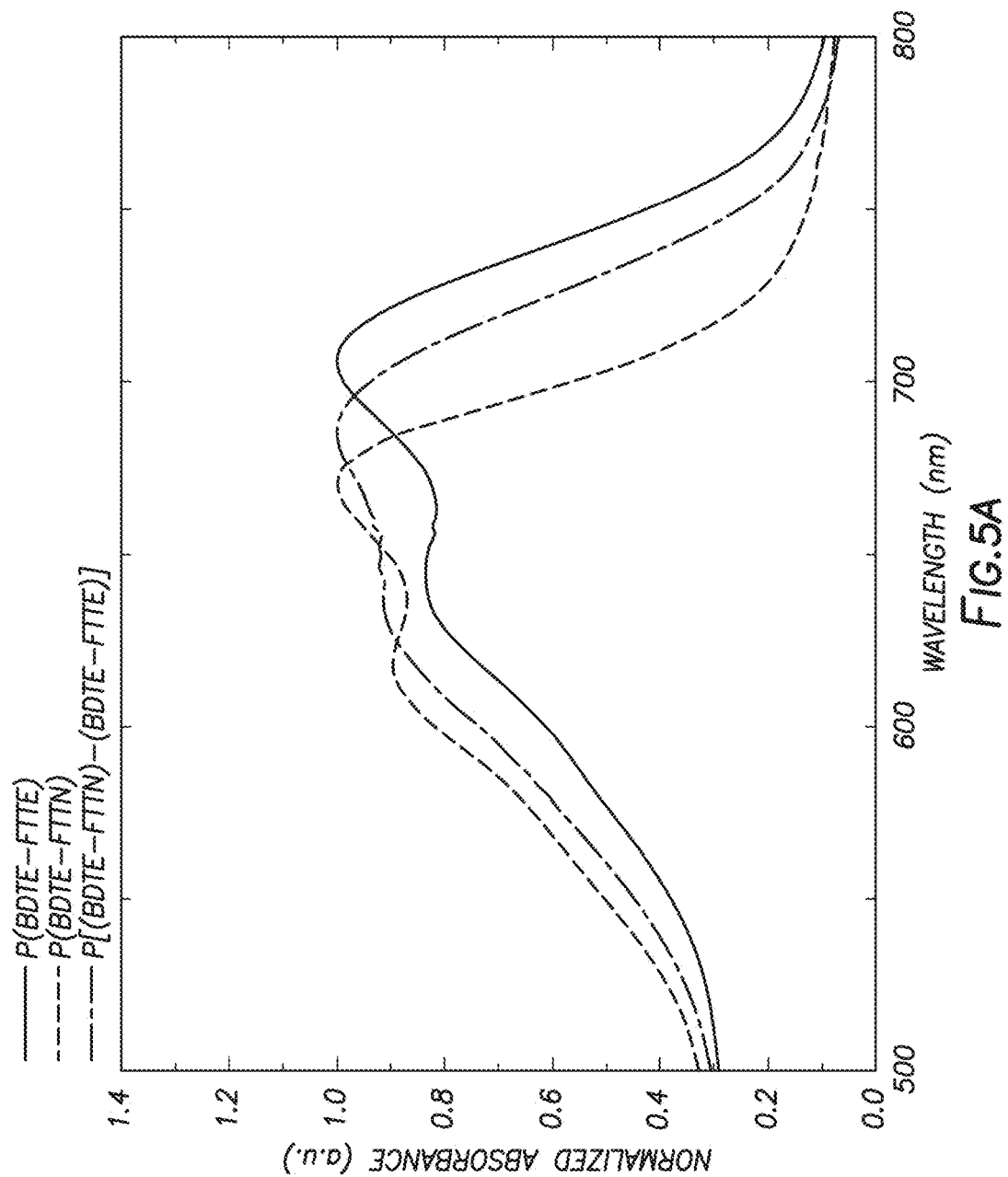

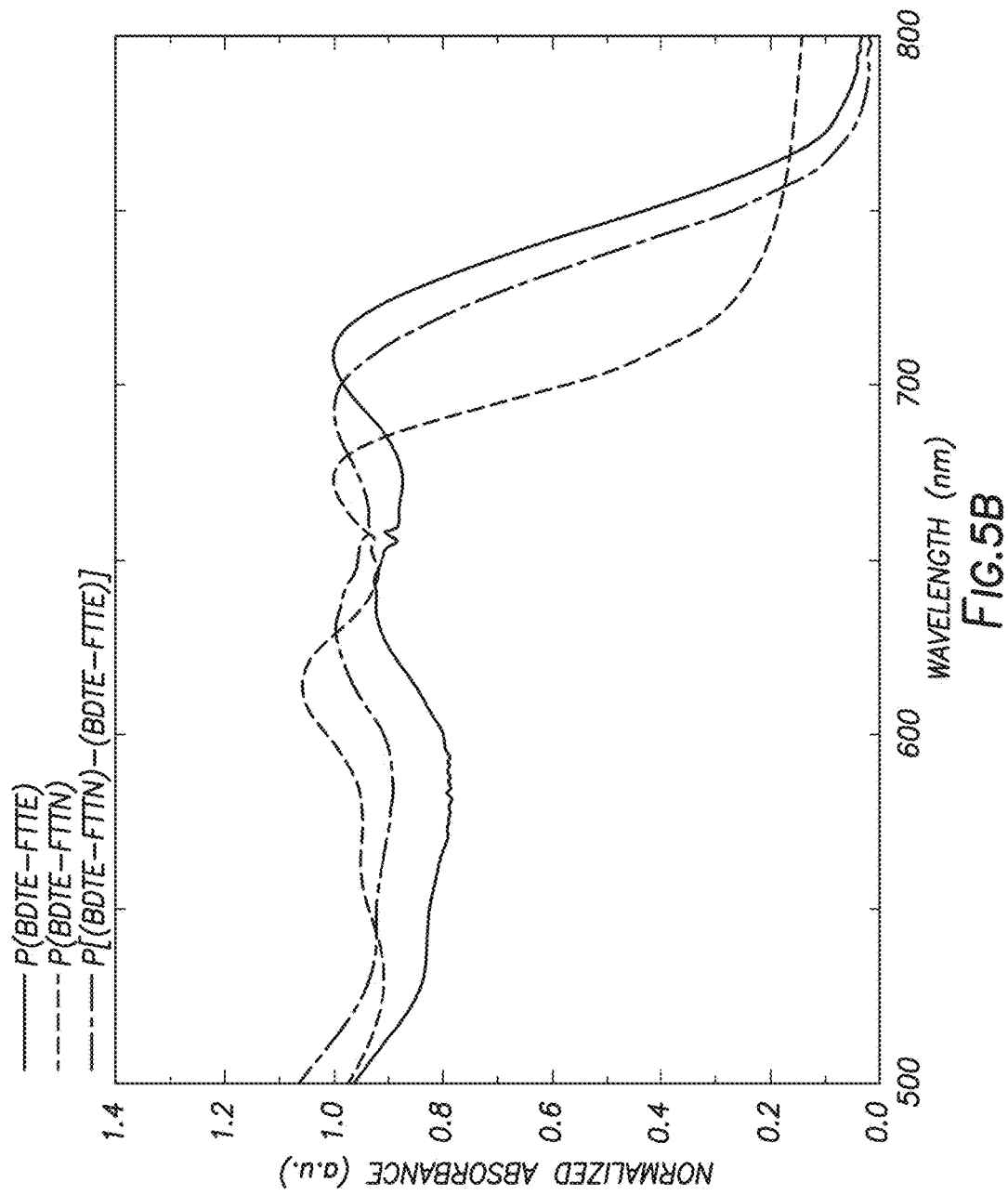

CONJUGATED POLYMER BLENDS FOR HIGH EFFICIENCY ORGANIC SOLAR CELLS

CROSS-REFERENCE TO RELATED APPLICATIONS

This application is a non-provisional application which claims the benefit of and priority to U.S. Provisional Application Ser. No. 62/336,016 filed May 13, 2016, entitled "Conjugated Polymer Blends for High Efficiency Organic Solar Cells," which is hereby incorporated by reference in its entirety.

STATEMENT REGARDING FEDERALLY SPONSORED RESEARCH OR DEVELOPMENT

None.

FIELD OF THE INVENTION

This invention relates to conjugated polymer blends for high efficiency organic solar cells.

BACKGROUND OF THE INVENTION

The conversion of light to electrical energy is a critical step in the organic photovoltaic charge generation mechanism. This energy transfer first requires the absorption of light by the photoactive layer materials. The standard source of light for photovoltaics is the sun. It is therefore required to match the polymer absorption with the solar spectrum. In general, the more light absorbed (extinction coefficient) and greater spectral overlap of the absorbing polymer with the solar spectrum, the higher the short-circuit current density in devices.

A common method for increasing the spectral light absorption of semiconducting polymers is by decreasing the bandgap. This can be achieved by altering the polymer backbone by using alternating copolymers of an electron rich and deficient monomer units. Decreasing the polymer bandgap red-shifts the absorbance, allowing a greater portion of the solar spectrum to be absorbed. Broadening the absorption range allows for additional photon absorption, which may provide an avenue for further improvements to device performance.

There exists a need to enhance light absorption in organic photovoltaics devices to improve power conversion efficiency.

BRIEF SUMMARY OF THE DISCLOSURE

The invention relates to a process for producing a conjugated polymer blend. The process for producing the conjugated polymer blend comprises the mixture of: polymer A (X-Y), where X is

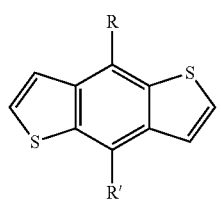

and Y is

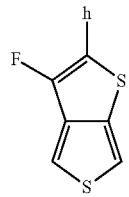

and h is a substituent, a polymer B (X-Y') where X is

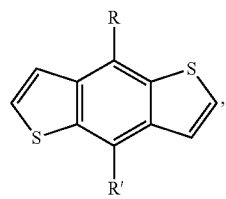

Y' is

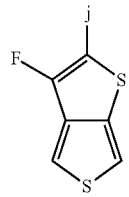

and j is a substituent, and an acceptor. In this process h and j are different substituents and independently selected from each other.

In an alternate embodiment the process for producing a blended conjugated polymer can also be prepared by the mixture of: a polymer A (benzo[1,2-b:3,4-b']dithiophene-fluorothienothiophene); a polymer B (benzo[1,2-b:3,4-b']dithiophene-3-fluoro-N,N-dihexylthieno[3,4-b]thiophene-2-carboxamide) and a phenyl-C61-butyric acid methyl ester acceptor.

BRIEF DESCRIPTION OF THE DRAWINGS

A more complete understanding of the present invention and benefits thereof may be acquired by referring to the follow description taken in conjunction with the accompanying drawings in which:

FIG. 5a depicts the UV-vis absorbance spectra of P(BDTE-FTTE), P(BDTE-FTTN), and P[(BDTE-FTTE)$_{0.5}$-(BDTE-FTTN)$_{0.5}$] each mixed with PCBM.
FIG. 5b depicts the UV-vis absorbance spectra of P(BDTE-FTTE), P(BDTE-FTTN), and P[(BDTE-FTTE)$_{0.5}$-(BDTE-FTTN)$_{0.5}$] each mixed with PCBM.

DETAILED DESCRIPTION

Figure 1:
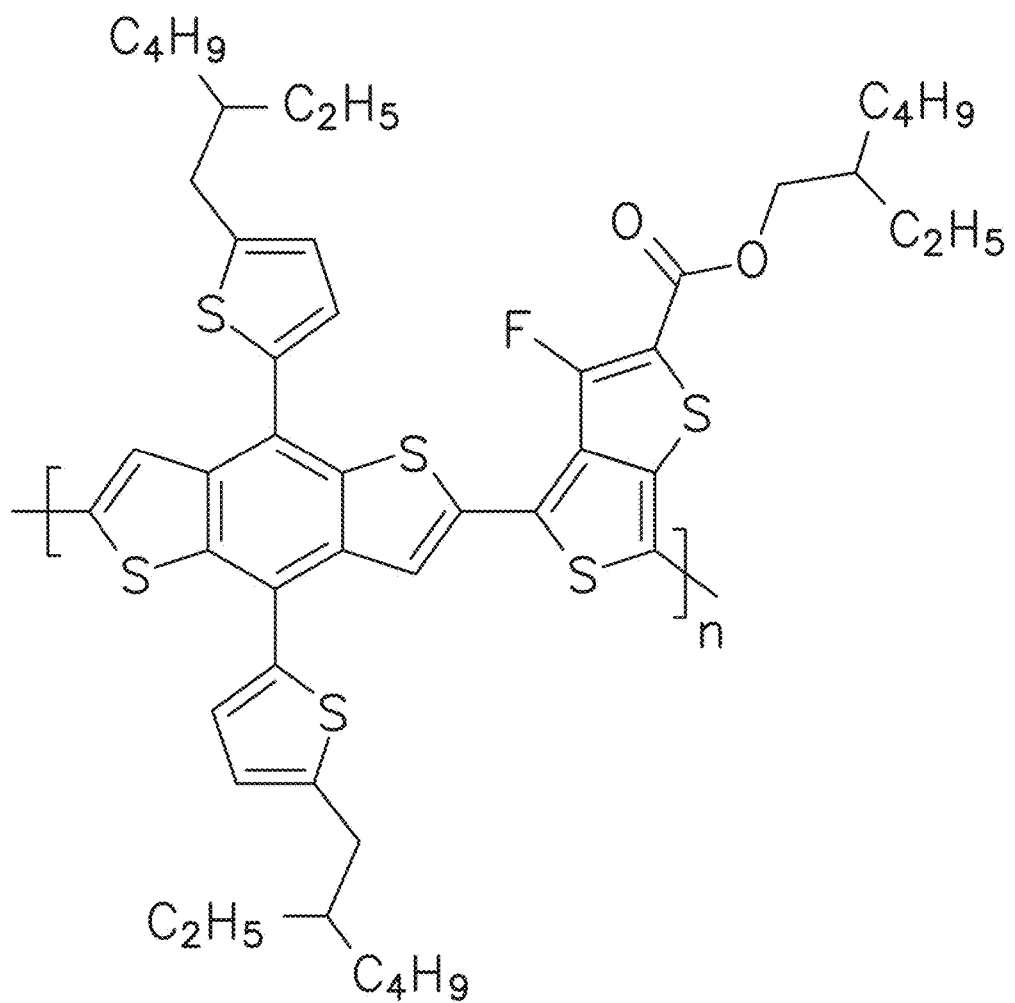
FIG. 1 depicts the polymer P(BDTE-FTTE).

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

The invention relates to a process for producing a conjugated polymer blend. The process for producing the conjugated polymer blend comprises the mixture of: a polymer A (X-Y), where X is

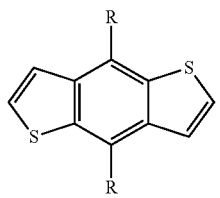

and Y is

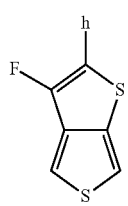

and h is a substituent, a polymer B (X-Y') where X is

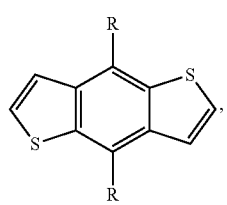

Y' is

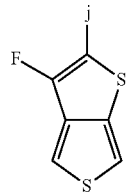

and j is a substituent, and an acceptor. In this process h and j are different substituents and independently selected from each other In another embodiment the substituent groups h and j can be different or not present. For example it is possible that polymer A has an h substituent group and polymer B does not have a j substituent group. Alternatively, it is possible that polymer A does not have a substituent group and polymer B has a j substituent group.

The substituent groups h and j can be independently selected from the group consisting of: a halogen functional group, a hydrocarbon functional group, an oxygen containing functional group, a nitrogen containing functional group, a sulfur containing functional group, a phosphorus containing functional group and a boron containing functional group. In another embodiment the substituent groups h and j are different substituents independently selected from the group consisting of: a hydrogen, alkyl group, alkoxy group, aryl groups,

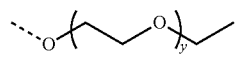

where y=1-3,

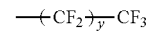

where y=0-12,

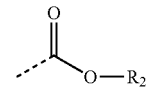

where R2 is selected from the group consisting of H, alkyl group, alkoxy group, aryl groups,

where R3 is selected from the group consisting of H, alkyl group, alkoxy group, aryl groups,

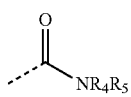

where R4 and R5 are independently selected from the group consisting of H, alkyl group, alkoxy group, aryl groups, —NR$_6$R$_7$ where R6 and R7 are independently selected from the group consisting of H, alkyl group, alkoxy group, aryl groups.

In one embodiment the ratio of polymer A to polymer B ranges from about 0.1% to about 99%. In other embodiments the ratio can be from about 3% to 50%, 3% to 25%, 3% to 20%, or even 3% to 10%.

In another embodiment the ratio of polymer A and polymer B to the acceptor ranges from about 1:0.8 to about 1:3. In other embodiments the ratio of polymer A and polymer B to the acceptor can range from about 1:1.4 to about 1:1.7 or even 1:1.6.

The acceptor for the process can be any conventionally known or used material. One type of acceptor can be small n-type polymers and small molecules, such as n-type semiconducting acceptors or organic n-type semiconducting acceptors. Other examples of acceptors that can be used include a phenyl-C61-butyric acid methyl ester, a fullerene —C70, a fullerene C60, a fullerene C84, a pentadeuterophenyl C61 butyric acid methyl ester, a perylene-3,4,9,10-tetracarboxylic dianhydride, a phenyl-C61-butyric acid butyl ester, a phenyl-C61-butyric acid octyl ester, or even a thienyl C61 butyric acid methyl ester.

The following examples of certain embodiments of the invention are given. Each example is provided by way of explanation of the invention, one of many embodiments of the invention, and the following examples should not be read to limit, or define, the scope of the invention.

EXAMPLE 1

P(BDTE-FTTE)

Monomers BDTE (300 mg, 0.33 mmol) and FTTE (156.6 mg, 0.33 mmol) were combined in a Schlenk flask with Pd(PPh$_3$)$_4$ (38.3 mg, 0.033 mmol). The flask was evacuated for 1 h, then refilled with argon. Dry toluene (13.2 mL) and DMF (3.3 mL) were added, and three freeze-pump-thaw cycles were performed. The solution was then heated to 120° C. and stirred for 24 h under argon atmosphere. After cooling to room temperature, the reaction mixture was poured into methanol (100 mL), and the polymer was collected by filtration. The polymer was purified by Soxhlet extraction, washing sequentially with acetone, hexanes, and chloroform. The polymer, P(BDTE-FTTE), was recovered in the chloroform fraction (260 mg, 88% yield).

FIG. 1 depicts the polymer P(BDTE-FTTE).

EXAMPLE 2

P(BDTE-FTTN)

Monomers BDTE (300 mg, 0.33 mmol) and FTTN (174.9 mg, 0.33 mmol) were combined in a Schlenk flask with Pd(PPh$_3$)$_4$ (38.3 mg, 0.033 mmol). The flask was evacuated for 20 min, then refilled with argon. Dry toluene (8.8 mL) and DMF (2.2 mL) were added, and three freeze-pump-thaw cycles were performed. The solution was then heated to 120° C. and stirred for 22 h under argon atmosphere. After cooling to room temperature, the reaction mixture was poured into methanol (100 mL), and the polymer was collected by filtration. The polymer was purified by Soxhlet extraction, washing sequentially with acetone, hexanes, and chloroform. The polymer, P(BDTE-FTTN), was recovered in the chloroform fraction (233 mg, 75% yield).

Figure 2:
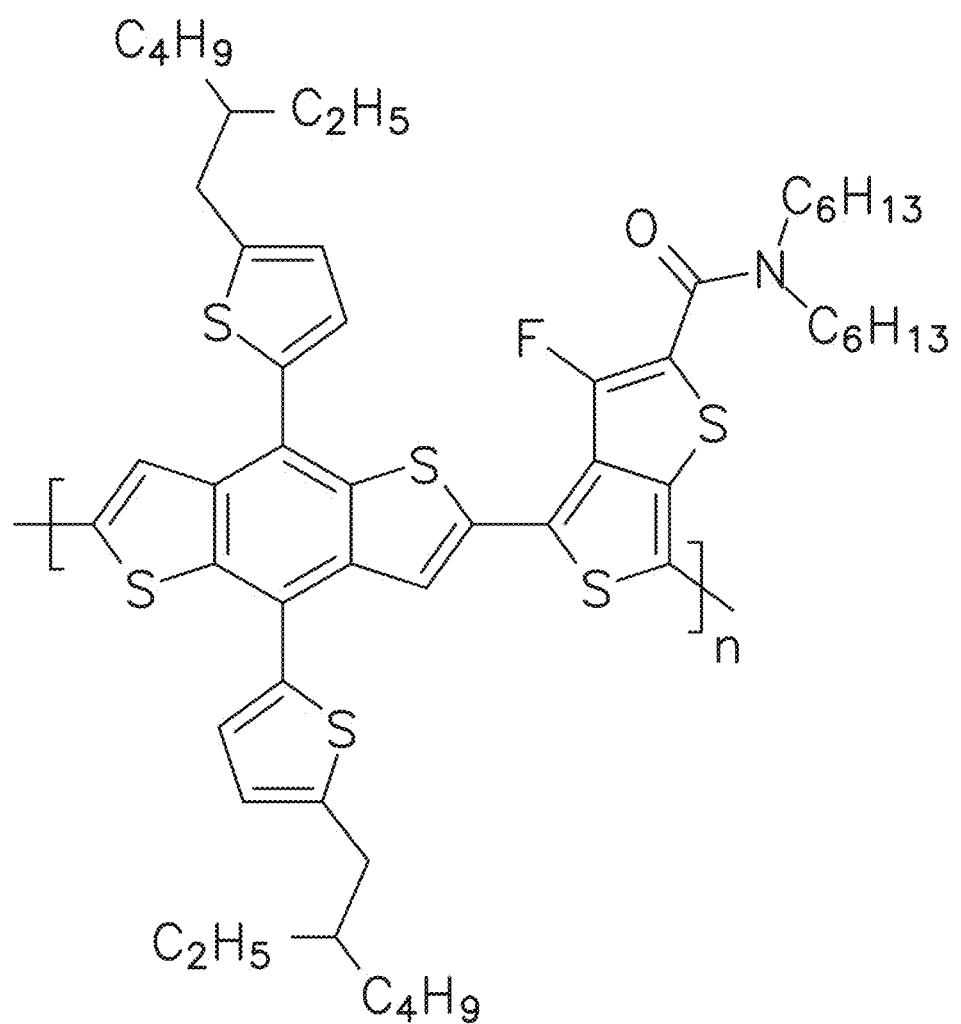
FIG. 2 depicts the polymer P(BDTE-FTTN).

FIG. 2 depicts the polymer P(BDTE-FTTN).

EXAMPLE 3

P[(BDTE-FTTE)$_{0.5}$-(BDTE-FTTN)$_{0.5}$]

Monomers BDTE (150 mg, 0.17 mmol), FTTN (43.7 mg, 0.083 mmol), and FTTE (39.2 mg, 0.083 mmol) were combined in a Schlenk flask with Pd(PPh$_3$)$_4$ (19.2 mg, 0.017 mmol). The flask was evacuated for 1 h, then refilled with argon. Dry toluene (6.6 mL) and DMF (1.65 mL) were added, and three freeze-pump-thaw cycles were performed. The solution was then heated to 120° C. and stirred for 25 h under argon atmosphere. After cooling to room temperature, the reaction mixture was poured into methanol (50 mL), and the polymer was collected by filtration. The polymer was purified by Soxhlet extraction, washing sequentially with acetone, hexanes, and chloroform. The polymer, P[(BDTE-FTTE)$_{0.5}$-(BDTE-FTTN)$_{0.5}$] was recovered in the chloroform fraction (233 mg, 72% yield).

Figure 3:
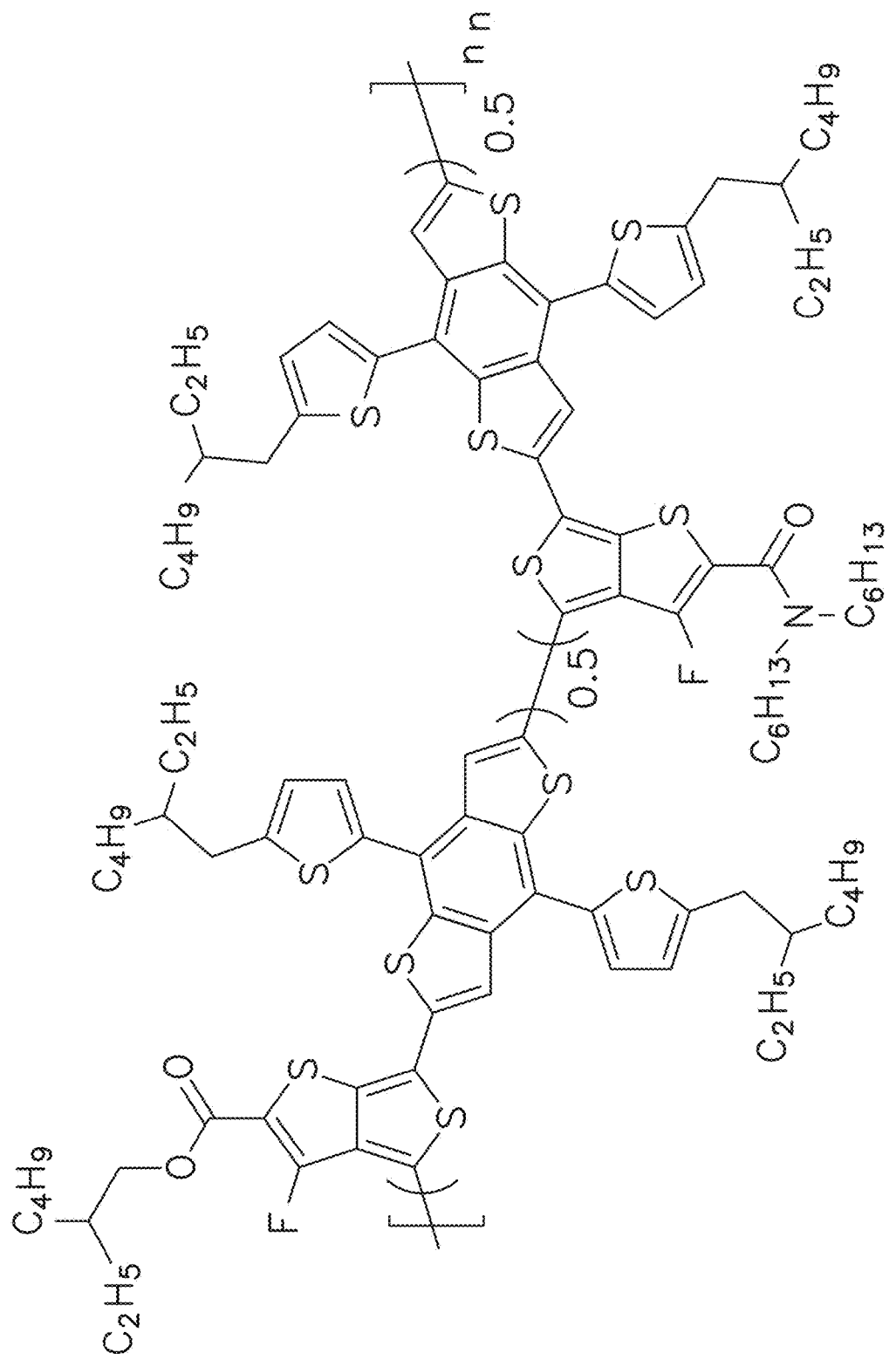
FIG. 3 depicts the polymer P[(BDTE-FTTE)$_{0.5}$-(BDTE-FTTN)$_{0.5}$].

FIG. 3 depicts the polymer P[(BDTE-FTTE)$_{0.5}$-(BDTE-FTTN)$_{0.5}$]

EXAMPLE 4

Blended Polymer of P(BDTE-FTTE) and P(BDTE-FTTN)

The photoactive layer consisted of a blend of two donor polymers, P(BDTE-FTT) and P(BDTE-FTTN), and acceptor PCBM at a ratio of 1:1.6 (polymer blend:PCBM). The blends were prepared by initially mixing two separate high concentration (75 mg/mL) stock solutions of each donor polymer with a 1:1.6 polymer:PCBM ratio in o-xylene. These stock solutions were stirred and heated [P(BDTE-FTT) at 80° C. and P(BDTE-FTTN) at 110° C.] overnight in a nitrogen filled glove box. Specific ratios of the two stock solutions were then mixed to yield a single donor polymer blend at 75 mg/mL concentration. This blend was then further diluted to 24-28 mg/mL in o-xylene and 2.5 vol. % of 1,8-diiodooctane (DIO) was added. The completed solution was heated on a hot plate at 80° C. for an hour and then filtered at 80° C. with a 2.7 µm glass fiber syringe filter.

Figure 4:
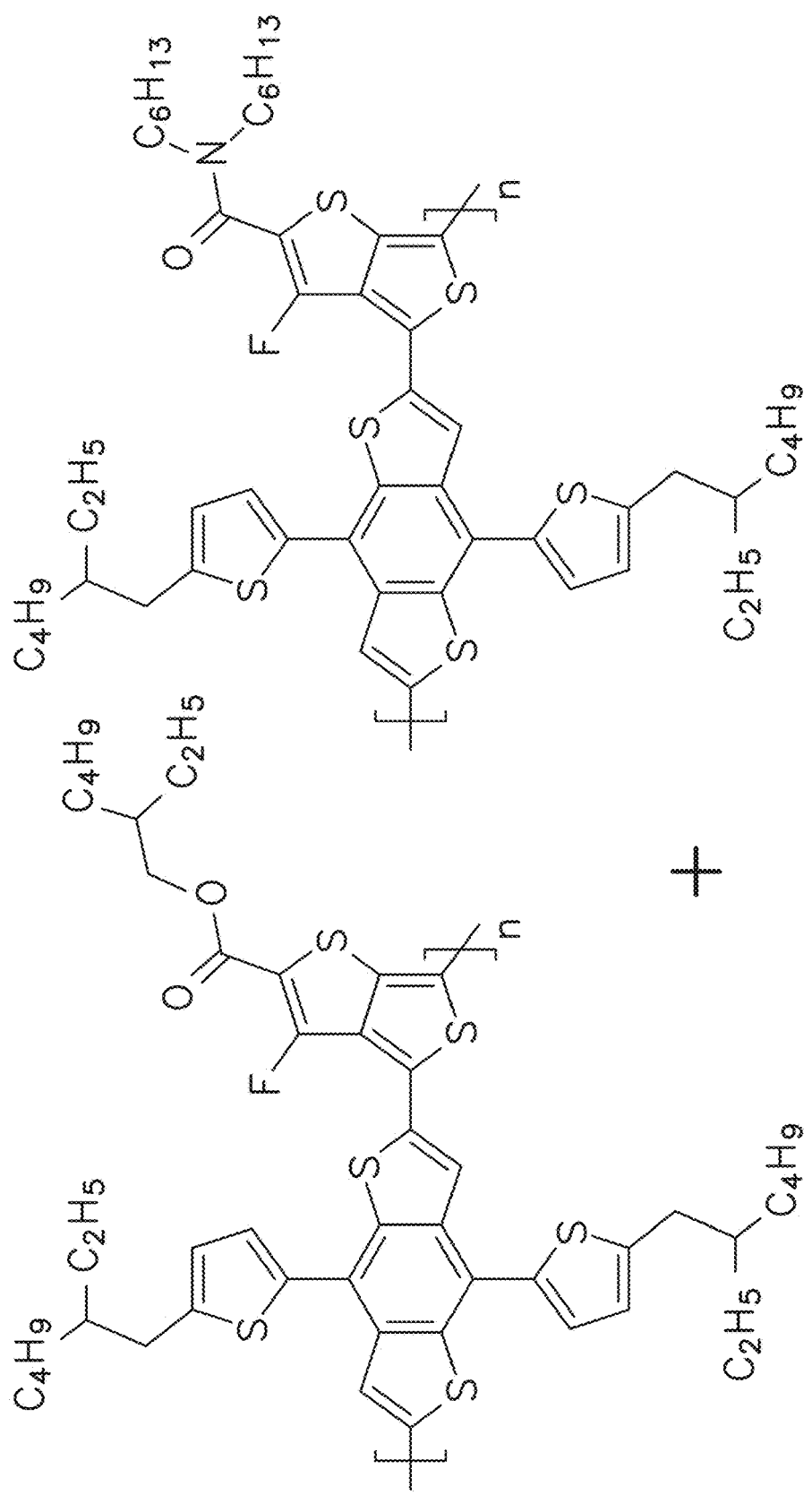
FIG. 4 depicts the blended polymer of P(BDTE-FTTE) and P(BDTE-FTTN).

FIG. 4 depicts the blended polymer of P(BDTE-FTTE) and P(BDTE-FTTN).

FIG. 5a depicts the UV-vis absorbance spectra of P(BDTE-FTTE), P(BDTE-FTTN), and P[(BDTE-FTTE)$_{0.5}$-(BDTE-FTTN)$_{0.5}$] mixed with PCBM using solid-state UV-visible absorption spectroscopy.

FIG. 5b depicts the UV-vis absorbance spectra of P(BDTE-FTTE), P(BDTE-FTTN), and P[(BDTE-FTTE)$_{0.5}$-(BDTE-FTTN)$_{0.5}$] mixed with PCBM in a 1:1.6 ratio with o-xylene, spun casted onto glass slides and characterized using solid-state UV-visible absorption spectroscopy.

Figure 6:
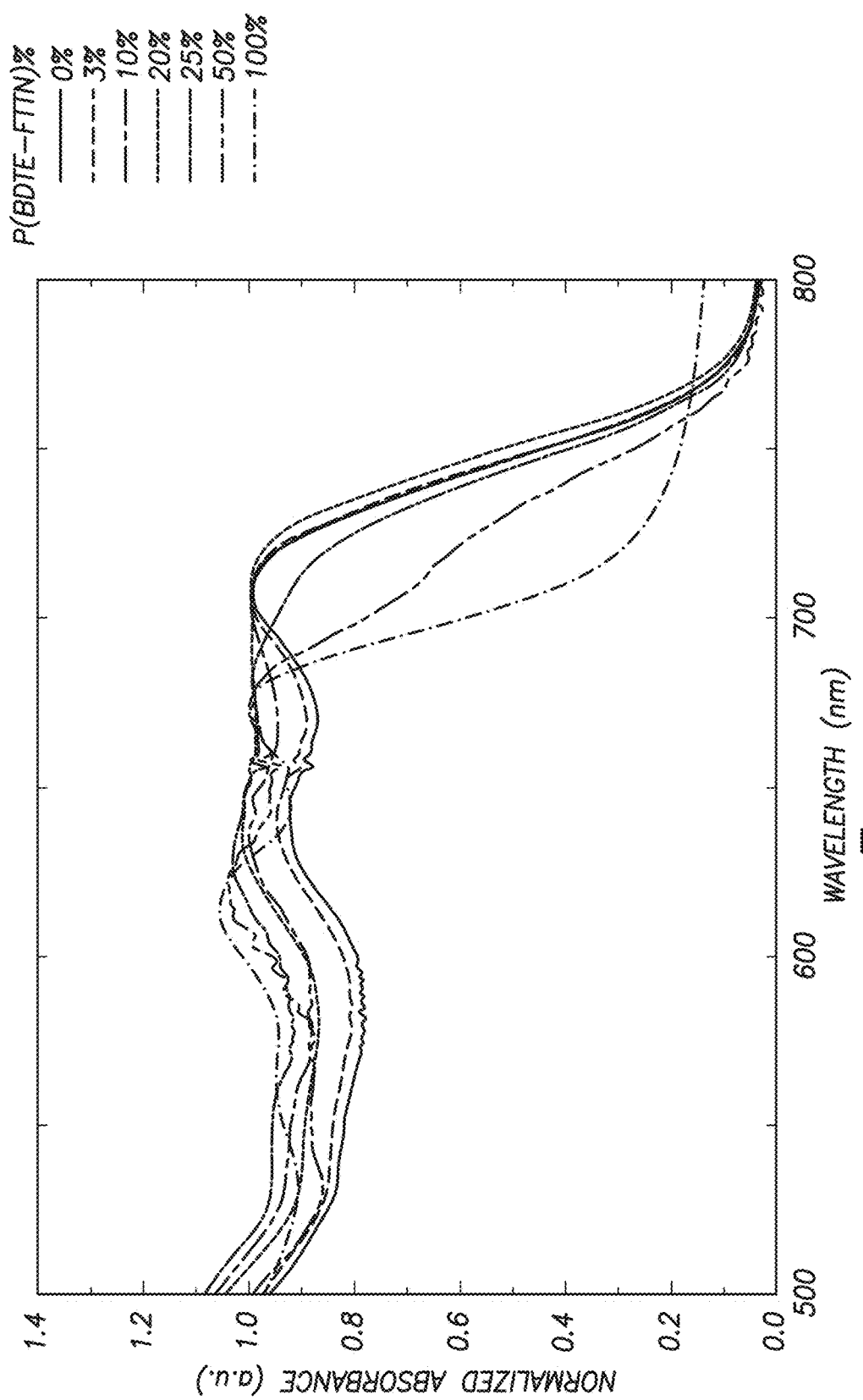
FIG. 6 depicts the UV-vis absorbance spectra of P(BDTE-FTTE) and P(BDTE-FTTN) polymer blends.

FIG. 6 depicts the UV-vis absorbance spectra of P(BDTE-FTTE) and P(BDTE-FTTN) polymer blends mixed with PCBM.

UV-visible absorbance spectra of P(BDTE-FTTE) blended with P(BDTE-FTTN) and PCBM.

Figure 7:
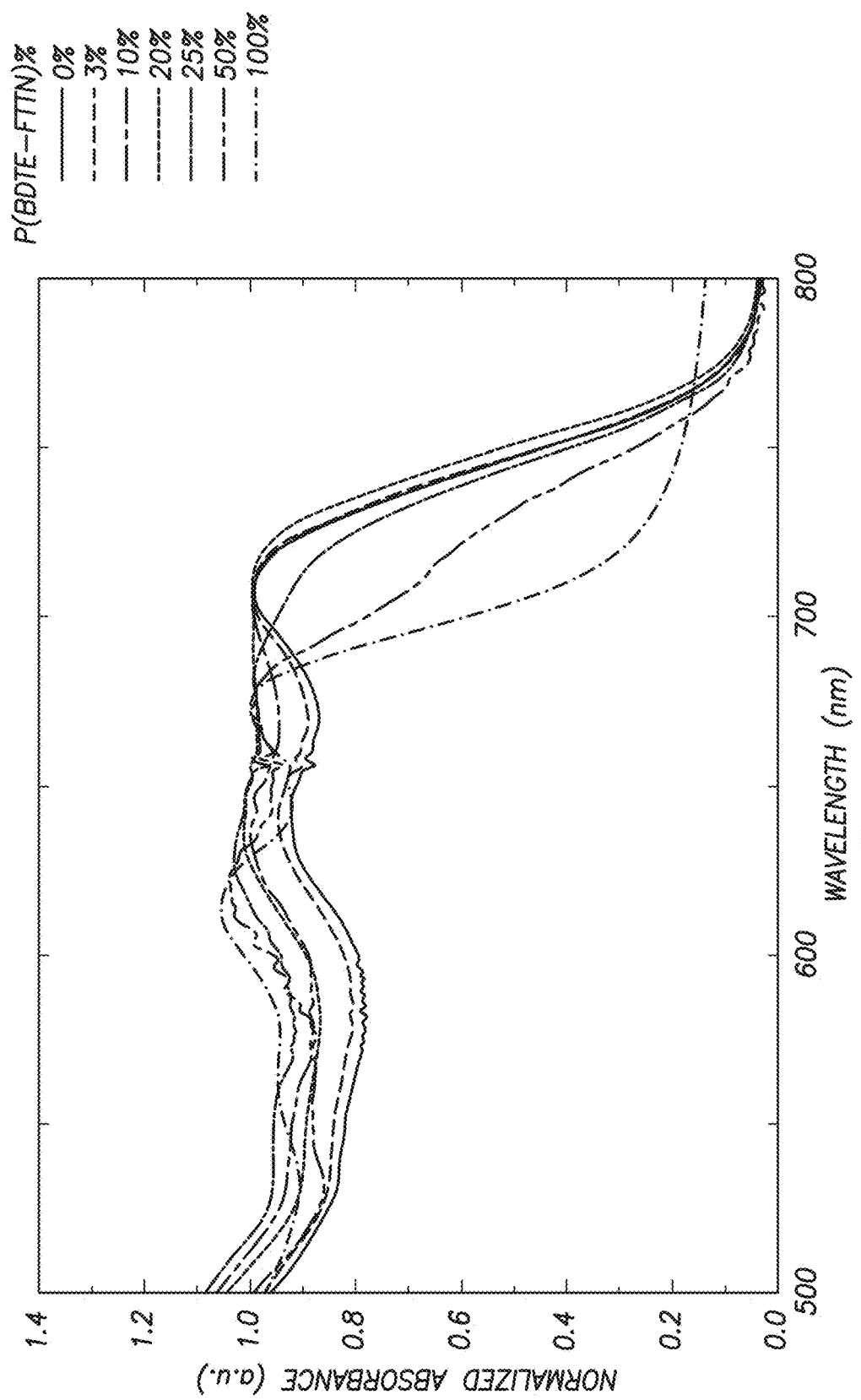
FIG. 7 depicts the thin film UV-visible absorbance spectra of P(BDTE-FTTE) blended with P(BDTE-FTTN) and PCBM, where the ratio of polymer to PCBM ratio is 1:1.6.

In one example the absorption range of the polymer active layer was tested by physically mixing the differently substituted polymers, P(BDTE-FTTN) polymer was blended with P(BDTE-FTTE) and PCBM and cast into films. Changing the film composition from 0-100% content of the P(BDTE-FTTN) polymer shows an expected blue-shift of ~40 nm in the absorbance $\lambda_{max}$ peak. The lowest energy absorption peak begins to broaden slightly with polymer concentrations as low as 3% P(BDTE-FTTN), and increases as the P(BDTE-FTTN) content increases. Beyond 20% P(BDTE-FTTN) content, the $\lambda_{max}$ begins to blue-shift to higher energy. To exploit the maximum absorbance range of a P(BDTE-FTTE) and P(BDTE-FTTN) polymer blend, contents equal to or greater than 20% P(BDTE-FTTN) can exhibit the largest benefit if proper film morphology can be obtained. FIG. 7 depicts the thin film UV-visible absorbance spectra of P(BDTE-FTTE) blended with P(BDTE-FTTN) and PCBM, where the ratio of polymer to PCBM ratio is 1:1.6.

Atomic force microscopy height and phase images of the 50% P(BDTE-FTTN) ternary blend and P[(BDTE-FTTE)$_{0.5}$-(BDTE-FTTN)$_{0.5}$] random copolymer with PCBM.

Figure 8:
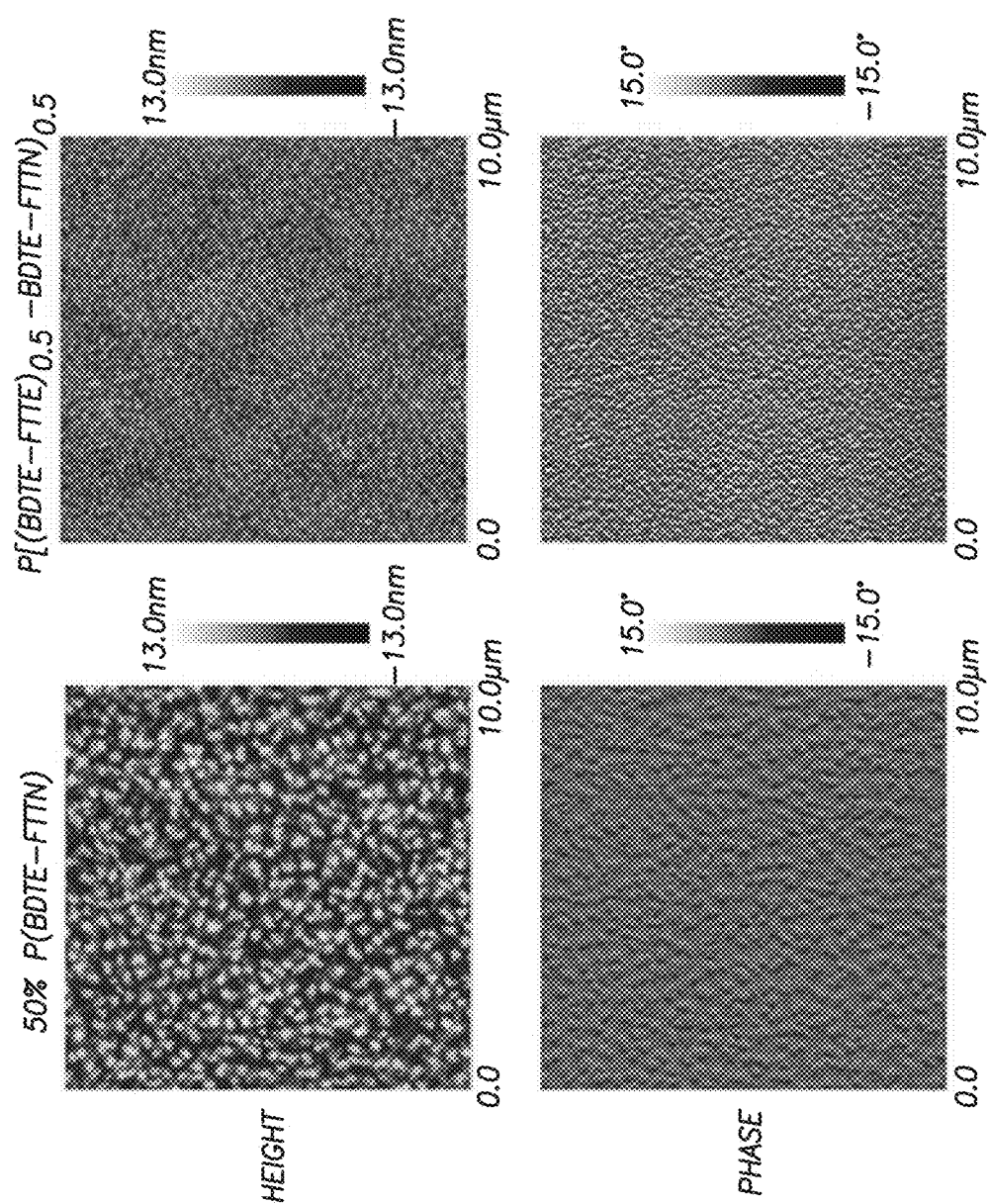
FIG. 8 depicts the atomic force microscopy height and phase images of the 50% P(BDTE-FTTN) ternary blend and P[(BDTE-FTTE)$_{0.5}$-(BDTE-FTTN)$_{0.5}$] random copolymer with PCBM.

To investigate the role of morphology in the ternary and binary blends, the morphology of films was characterized using atomic force microscopy (AFM). FIG. 8 shows height and phase images of 50% P(BDTE-FTTN) ternary and P[(BDTE-FTTE)$_{0.5}$-(BDTE-FTTN)$_{0.5}$] binary blend films. The height images show large features in the ternary films with an average diameter of 200±45 nm. The binary blend containing P[(BDTE-FTTE)$_{0.5}$-(BDTE-FTTN)$_{0.5}$] contains smaller and more uniform particles on the surface with an average diameter of 130±15 nm. These features are also reflected in the phase images. Photovoltaic devices containing these photoactive layer compositions show that the $V_{oc}$ (0.75 V) is similar between 50% P(BDTE-FTTN) and P[(BDTE-FTTE)$_{0.5}$-(BDTE-FTTN)$_{0.5}$] containing devices. However, the $J_{sc}$ and FF are significantly lower in the ternary 50% P(BDTE-FTTN) devices compared to the random copolymer. Since the 50% P(BDTE-FTTN) morphology contains larger domain sizes, as evidenced from the AFM images, generated charges can suffer a higher recombination loss and reduce the FF compared to the smaller, uniform domains in the binary P[(BDTE-FTTE)$_{0.5}$-(BDTE-FTTN)$_{0.5}$] system. Even though the 50% P(BDTE-FTTN) ternary system has advantageous light absorption at lower photon energies compared to P[(BDTE-FTTE)$_{0.5}$-(BDTE-FTTN)$_{0.5}$], the $J_{sc}$ of the ternary system is still reduced due to unfavorable morphology.

The AFM morphology results highlight the difficult relationship between increasing absorption of polymer films while maintaining the good morphology and charge transport required in a three component photoactive layer. It is theorized that as the P(BDTE-FTTN) content increases, the bandwidth of light absorption improves but suffers from poor mixing of the three components in the photoactive layer, reducing the FF as the amide polymer content increases.

Device Fabrication

Figure 9:
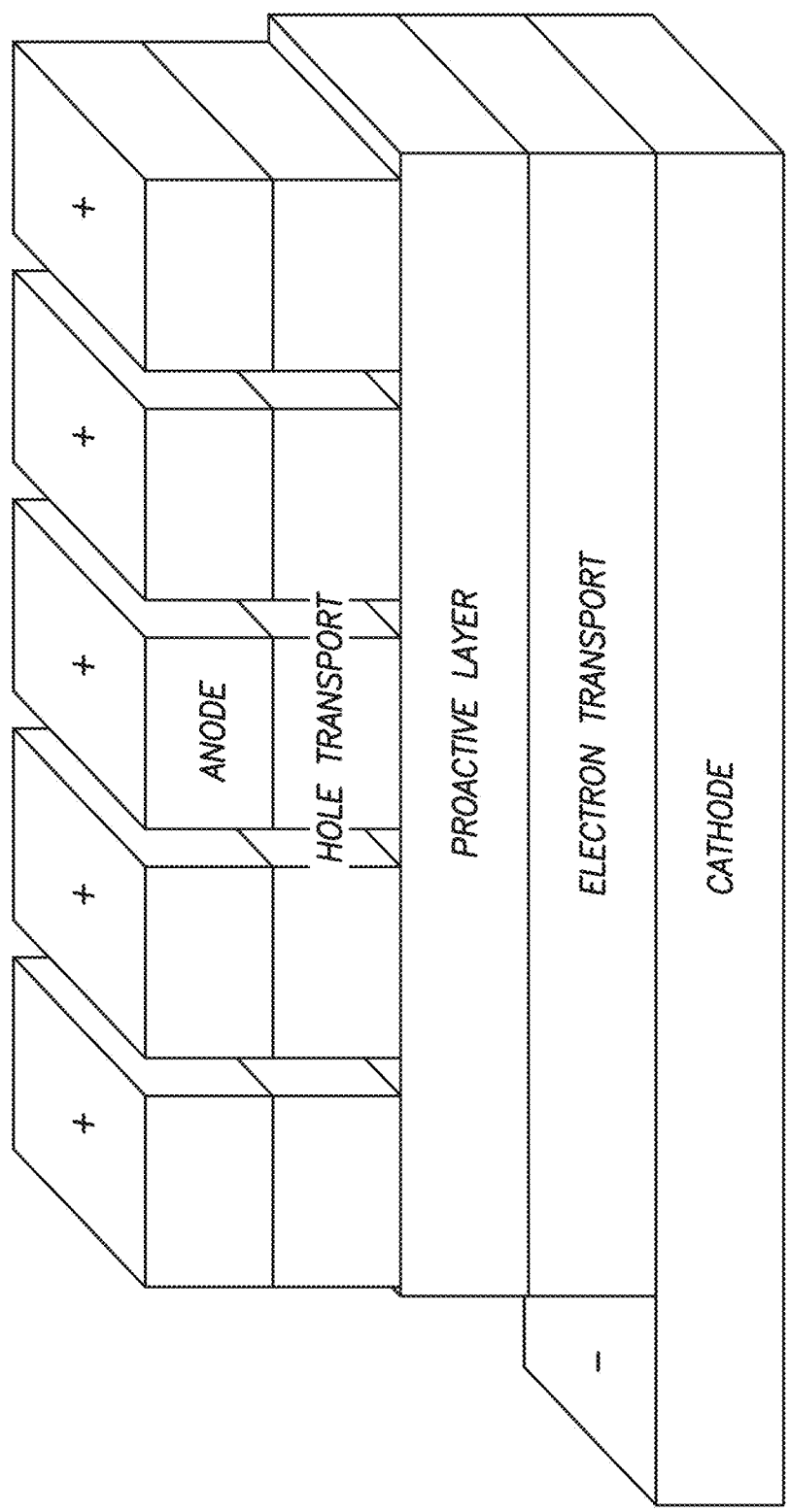
FIG. 9 depicts a schematic of the organic photovoltaic device.

Different devices were made from Examples 1-4. A schematic of the organic photovoltaic device is shown on FIG. 9. In these devices the anode is Ag, the hole transport layer is MoOx, the photoactive layers are the polymer blends from the examples above, the electron transport layers are zinc oxide sol-gel solutions and the cathodes were indium tin oxide. Table 1 below describes the photovoltaic parameters of the different polymers when made into photovoltaic devices. In table 1 below the following measurements were calculated/tested: low short-circuit current density (Jsc), fill factor (FF), and a high open-circuit voltage (Voc), power conversion efficiency (PCE), sheet resistance (Rs) and shunt resistance (Rsh).

| Polymer Blend | | $V_{oc}$ (V) | $J_{sc}$ (mA/cm$^2$) | FF (%) | PCE (%) | $R_s$ ($\Omega$ cm$^2$) | $R_{sh}$ ($\Omega$ cm$^2$) |
|---|---|---|---|---|---|---|---|
| 100% P(BDTE-FTTE) | average | 0.791 | 17.1 | 71.4 | 9.7 | 3.1 | 1000 |
| | best | 0.794 | 17.5 | 72.4 | 10.0 | 2.8 | 1200 |
| Blended 3% P(BDTE-FTTN) 97% P(BDTE-FTTE) | average | 0.789 | 17.1 | 72 | 9.8 | 3.0 | 1100 |
| | best | 0.791 | 17.4 | 74 | 10.1 | 2.6 | 1300 |
| Blended 10% P(BDTE-FTTN) 90% P(BDTE-FTTE) | average | 0.783 | 16.9 | 71 | 9.4 | 4 | 1300 |
| | best | 0.788 | 17.3 | 74 | 9.9 | 3 | 1700 |
| Blended 20% P(BDTE-FTTN) 80% P(BDTE-FTTE) | average | 0.778 | 16.6 | 64 | 8.3 | 5.2 | 1190 |
| | best | 0.781 | 16.9 | 66 | 8.6 | 4.8 | 1350 |
| Blended 25% P(BDTE-FTTN) 75% P(BDTE-FTTE) | average | 0.764 | 16.2 | 64 | 7.9 | 5 | 1100 |
| | best | 0.774 | 16.6 | 68 | 8.6 | 4 | 1400 |
| Blended 50% P(BDTE-FTTN) 50% P(BDTE-FTTE) | average | 0.75 | 14.6 | 55 | 6.0 | 8 | 670 |
| | best | 0.78 | 15.7 | 60 | 7.3 | 6 | 730 |
| 100% P(BDTE-FTTN) | average | 0.71 | 9.83 | 47.7 | 3.3 | 20.9 | 400 |
| | best | 0.76 | 9.93 | 48.8 | 3.5 | 19.5 | 420 |
| P[(BDTE-FTTE)0.5 - (BDTE-FTTN)0.5] | average | 0.748 | 16.0 | 62 | 7.4 | 5.5 | 1100 |
| | best | 0.758 | 16.3 | 64 | 7.9 | 3.6 | 1700 |

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. A conjugated polymer blend comprising:
   a polymer having a structural unit A: (benzo[1,2-b:3,4-b']dithiophene-fluorothienothiophene);
   a polymer having a structural unit B: (benzo[1,2-b:3,4-b']dithiophene-3-fluoro-N,N-dihexylthieno[3,4-b]thiophene-2-carboxamide) and
   a phenyl-C61-butyric acid methyl ester acceptor.

\* \* \* \* \*